United States Patent [19]

Clouser et al.

[11] Patent Number: 6,123,788
[45] Date of Patent: *Sep. 26, 2000

[54] COPPER WIRE AND PROCESS FOR MAKING COPPER WIRE

[75] Inventors: Sidney J. Clouser, Chardon, Ohio; Rudolf Wiechmann, Freiberg, Germany; Bernd Schneider, March, Germany; Ulrike Bohmler, Emmendingen, Germany; R. Duane Apperson, McConnelsville; Robert J. Fedor, Westlake, both of Ohio; Sharon K. Young, Tucson, Ariz.; Roger N. Wright, Rexford, N.Y.; Stephen J. Kohut, Chandler; Susan S. Enos, Tucson, both of Ariz.

[73] Assignee: Electrocopper Products Limited, Mesa, Ariz.

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/647,707

[22] Filed: May 24, 1996

Related U.S. Application Data

[63] Continuation-in-part of application No. 08/634,271, Apr. 18, 1996, Pat. No. 5,679,232, which is a continuation-in-part of application No. 08/329,235, Oct. 26, 1994, Pat. No. 5,516, 408, which is a continuation-in-part of application No. 08/049,176, Apr. 19, 1993, Pat. No. 5,366,612, and a continuation-in-part of application No. 08/287,703, Aug. 9, 1994, Pat. No. 5,458,746, which is a continuation of application No. 08/049,160, Apr. 19, 1993, abandoned

[60] Provisional application No. 60/000,277, Jun. 16, 1995.

[51] Int. Cl.[7] ..................................................... C22F 1/08

[52] U.S. Cl. ............................... 148/684; 205/76; 205/77

[58] Field of Search .................................... 148/684, 432; 205/50, 76, 77

[56] References Cited

U.S. PATENT DOCUMENTS

| 440,548 | 11/1890 | Elmore et al. | 205/73 |
| 1,058,048 | 4/1913 | Gibbs | 205/138 |

(List continued on next page.)

FOREIGN PATENT DOCUMENTS

| 207244 | 1/1987 | European Pat. Off. . |
| 49-27244 | 7/1974 | Japan . |
| 401268091 | 10/1989 | Japan . |
| 91/19024 | 12/1991 | WIPO . |

OTHER PUBLICATIONS

Search Report mailed Nov. 29, 1996 for PCT International Application PCT/US96/08032.

(List continued on next page.)

*Primary Examiner*—Sikyin Ip
*Attorney, Agent, or Firm*—Renner, Otto, Boisselle & Sklar, LLP

[57] ABSTRACT

This invention relates to copper wire having a substantially uniform unoriented grain structure that is essentially columnar grain free. This invention also relates to a process for making copper wire comprising: cutting copper foil to form at least one strand of copper wire, said copper foil being an annealable electrodeposited copper foil having a substantially uniform unoriented grain structure that is essentially columnar grain free, said foil being characterized by a fatigue ductility of at least about 25% after being annealed at 177° C. for 15 minutes; and shaping said strand of wire to provide said strand with desired cross-sectional shape and size. This invention also relates to a process for making copper wire comprising: flowing an aqueous electrolyte solution between an anode and a cathode and applying an effective amount of voltage across the anode and the cathode to deposit copper foil on the cathode, said electrolyte solution being characterized by a chloride ion concentration of up to about 5 ppm and an organic additive concentration of up to about 0.2 ppm; cutting said foil to form at least one strand of wire; and shaping said strand of wire to provide said strand with desired cross-sectional shape and size.

21 Claims, 3 Drawing Sheets

6,123,788
Page 2

U.S. PATENT DOCUMENTS

| | | | |
|---|---|---|---|
| 2,074,713 | 3/1937 | Tross | 29/33 |
| 3,556,957 | 1/1971 | Toledo | 204/32 |
| 3,672,430 | 6/1972 | Cofer | 164/76 |
| 3,683,662 | 8/1972 | Dechene et al. | 72/235 |
| 3,811,309 | 5/1974 | Nordstrom | 72/235 |
| 3,929,610 | 12/1975 | Wang | 204/13 |
| 3,939,745 | 2/1976 | Weeks et al. | 83/425.3 |
| 4,018,073 | 4/1977 | Bartram et al. | 72/199 |
| 4,037,445 | 7/1977 | Winter et al. | 72/60 |
| 4,083,758 | 4/1978 | Hamby et al. | 204/106 |
| 4,193,846 | 3/1980 | Barrett | 204/13 |
| 4,891,105 | 1/1990 | Roggero Sein | 204/28 |
| 4,956,053 | 9/1990 | Polan et al. | 204/13 |
| 5,031,432 | 7/1991 | Loesch et al. | 72/13 |
| 5,060,499 | 10/1991 | Poloni | 72/201 |
| 5,066,366 | 11/1991 | Lin | 204/12 |
| 5,086,634 | 2/1992 | Richards | 72/161 |
| 5,215,645 | 6/1993 | DiFranco et al. | 205/77 |
| 5,238,048 | 8/1993 | Hackman | 164/463 |
| 5,366,612 | 11/1994 | Clouser et al. | 205/73 |
| 5,403,465 | 4/1995 | Apperson et al. | 205/77 |
| 5,431,803 | 7/1995 | DiFranco et al. | 205/50 |
| 5,516,408 | 5/1996 | Peckham et al. | 205/580 |
| 5,679,232 | 10/1997 | Fedor et al. | 205/77 |

OTHER PUBLICATIONS

V.I. Lakshmanan et al; "The Effect of Chloride Ion In The Electrowinning of Copper", Journal of Applied Electrochemistry 7 (1977) 81–90, pp. 81, 83, 85, 87, 89. Enclosed.

"A New Ductility and Flexural Fatigue Test Method for Copper Foil and Flexible Printed Wiring" by W. Engelmaier, 21st Proceedings of the Annual IPC Meeting, Washington, D.C. (Apr. 1978).

"Copper Foil for Flexible Circuits", D. Avery, *Circuit World*, 14(2)16 (1988). pp. 16–20.

"Results of the IPC Copper Foil Ductility Round–Robin Study", W. Engelmaier, *Testing of Metallic and Inorganic Coatings*, 66 (1987). ASTM Special Technical Publication 947.

Bucci et al., "Copper Foil Technology", PC Fab., Jul. 1986, pp. 22–33.

COPPER WIRE AND PROCESS FOR MAKING COPPER WIRE

This application claims benefit of Provisional Application Ser. No. 60/000,277, filed Jul. 16, 1995.

This application is a continuation-in-part of U.S. application Ser. No. 08/634,271, filed Apr. 18, 1996 (now U.S. Pat. No. 5,679,232) which was a continuation-in-part of U.S. application Ser. No.08/329,235, filed Oct. 26, 1994 (now U.S. Pat. No. 5,516,408); which was a continuation-in-part of Ser. No. 08/049,176, filed Apr. 19, 1993 (now U.S. Pat. No. 5,366,612), and a continuation-in-part of Ser. No. 08/287,703, filed Aug. 9, 1994 (now U.S. Pat. No. 5,458,746) which was a continuation of Ser. No. 08/049,160, filed Apr. 19, 1993 (now abandoned). The disclosures in these prior applications are incorporated herein by reference in their entirety.

TECHNICAL FIELD

This invention relates to a novel form of copper wire and to a novel process for making copper wire. The wire is characterized by a substantially uniform unoriented grain structure that is essentially columnar grain free. The process involves forming a low fatigue ductility electrodeposited copper foil, cutting the foil to form one or more strands of wire, and shaping the strands to provide wire with a desired cross sectional shape and size.

BACKGROUND OF THE INVENTION

The conventional method for making copper wire involves the following steps. Electrolytic copper (whether electrorefined, electrowon, or both) is melted, cast into bar shape, and hot rolled into a rod shape. The rod is then cold-worked as it is passed through drawing dies that systematically reduce the diameter while elongating the wire. In a typical operation, a rod manufacturer casts the molten electrolytic copper into a bar having a cross section that is substantially trapazoidal in shape with rounded edges and a cross sectional area of about 7 square inches; this bar is passed through a preparation stage to trim the corners, and then through 12 rolling stands from which it exits in the form of a 0.3125" diameter copper rod. The copper rod is then reduced to a desired wire size through standard round drawing dies. Typically, these reductions occur in a series of machines with a final annealing step and in some instances intermediate annealing steps to soften the worked wire.

The conventional method of copper wire production consumes significant amounts of energy and requires extensive labor and capital costs. The melting, casting and hot rolling operations subject the product to oxidation and potential contamination from foreign materials such as refractory and roll materials which can subsequently cause problems to wire drawers generally in the form of wire breaks during drawing.

By virtue of the inventive process, copper wire is produced in a simplified and less costly manner when compared to the prior art. The inventive process utilizes a copper source such as copper shot, copper oxide or recycled copper. This process does not require use of the prior art steps of first making copper cathodes then melting, casting and hot rolling the cathodes to provide a copper rod feedstock.

SUMMARY OF THE INVENTION

This invention relates to copper wire having a substantially uniform unoriented grain structure that is essentially columnar grain free. This invention also relates to a process for making copper wire comprising: cutting copper foil to form at least one strand of copper wire, said copper foil being an annealable electrodeposited copper foil having a substantially uniform unoriented grain structure that is essentially columnar grain free, said foil being characterized by a fatigue ductility of at least about 25% after being annealed at 177° C. for 15 minutes; and shaping said strand of wire to provide said strand with desired cross-sectional shape and size. This invention also relates to a process for making copper wire comprising: flowing an aqueous electrolyte solution between an anode and a cathode and applying an effective amount of voltage across the anode and the cathode to deposit copper foil on the cathode, said electrolyte solution being characterized by a chloride ion concentration of up to about 5 ppm and an organic additive concentration of up to about 0.2 ppm; cutting said foil to form at least one strand of wire; and shaping said strand of wire to provide said strand with desired cross-sectional shape and size.

BRIEF DESCRIPTION OF THE DRAWINGS

In the annexed drawings, like parts and features are designated by like reference numerals.

DESCRIPTION OF THE PREFERRED EMBODIMENTS

Figure 1:
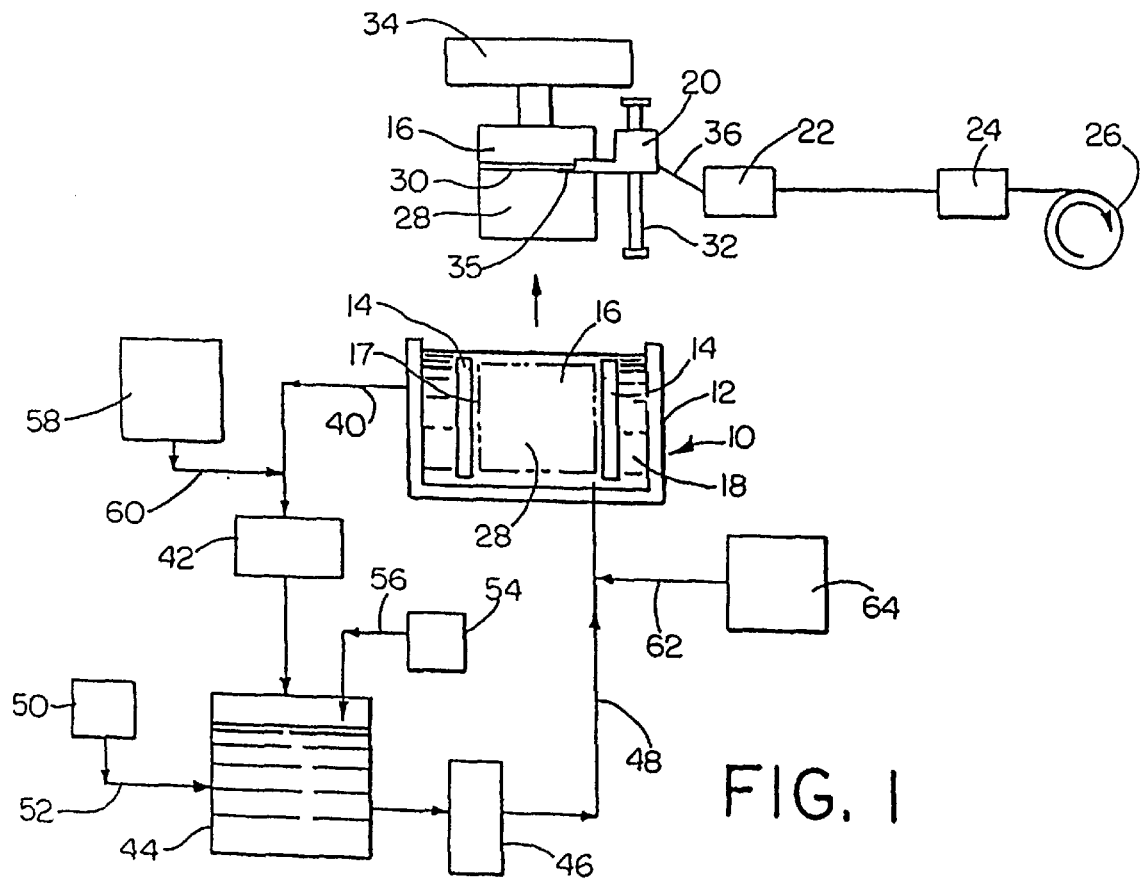
FIG. 1 is a flow sheet illustrating one embodiment of the invention wherein copper is electrodeposited on a vertically oriented cathode to form copper foil, the foil is score cut and removed from the cathode as a strand of copper wire, and then the copper wire is shaped to provide the copper wire with a desired cross-sectional shape and size.

The inventive copper wire exhibits a unique and novel combination of characteristics. In one embodiment, this wire has a substantially uniform unoriented grain structure that is essentially columnar grain free. In one embodiment, the inventive wire is essentially twin boundary free. In one embodiment, the inventive wire is substantially porosity free. The expressions "essentially columnar grain free", "essentially twin boundary free", and "substantially porosity free" refer to the fact that in most instances microscopic or transmission electron microscopy (TEM) analysis of the inventive wire demonstrates that such wire is columnar grain free, twin boundary free or porosity free, but that on occasions minor amounts of columnar grain formation, twin boundary formation and/or porosity may be observed. In one embodiment, the inventive copper wire is free of oxide inclusions. An advantage of the inventive copper wire is that it can be drawn more easily than wire in the prior art.

In one embodiment, the inventive wire has an average grain size of up to about 8 microns, and in one embodiment in the range of about 0.5 to about 8 microns. In one embodiment, the inventive wire as produced, prior to any annealing or heat treating, has an average grain size in the range of up to about 5 microns, and in one embodiment in the range of about 0.5 to about 5 microns, and in one embodiment about 1 to about 4 microns.

In one embodiment, the inventive wire has an ultimate tensile strength (UTS) at 23° C. in the range of about 60,000 psi to about 95,000 psi, and in one embodiment about 60,000 psi to about 85,000 psi, and in one embodiment about 65,000 psi to about 75,000 psi. In one embodiment, the UTS for this wire at 180° C. is in range of about 22,000 psi to about 32,000 psi, and in one embodiment about 23,000 psi to about 30,000 psi, and in one embodiment about 25,000 to about 28,000 psi. In one embodiment, the elongations for this wire at 23° C. are about 8% to about 18%, and in one embodiment about 9% to about 16%, and in one embodiment about 9% to about 14%. In one embodiment, the elongations for this wire at 180° C. are about 24% to about 45%, and in one embodiment about 27% to about 41%, and in one embodiment about 29% to about 38%.

In one embodiment, the inventive copper wire is cold worked to a reduction of about 60% and this wire has a tensile strength in the range of about 65,000 psi to about 90,000 psi, and in one embodiment about 70,000 psi to about 75,000 psi, and an elongation of about 0% to about 4%, and in one embodiment about 0% to about 2%, and in one embodiment about 1%.

In one embodiment, the inventive copper wire is cold worked to a reduction of about 60% and then annealed at a temperature of 200° C. for two hours. This wire has a tensile strength in the range of about 25,000 psi to about 40,000 psi, and in one embodiment about 27,000 psi to about 30,000 psi, and an elongation of at least about 30%, and in one embodiment about 30% to about 40%.

In one embodiment, the inventive copper wire has a conductivity of at least about 100% IACS (International Annealed Copper Standard), and in one embodiment about 100% to about 102.7% IACS.

In one embodiment, the invention relates to a process for making copper wire comprising: cutting copper foil to form at least one strand of copper wire, said copper foil being an annealable electrodeposited copper foil having a substantially uniform unoriented grain structure that is essentially columnar grain free, said foil being characterized by a fatigue ductility of at least about 25% after being annealed at 177° C. for 15 minutes; and shaping said strand of wire to provide said strand with desired cross-sectional shape and size.

The copper foils used in accordance with this process are high fatigue ductility electrodeposited copper foils that exhibit a unique and novel combination of characteristics. These foils are low temperature annealable foils that have a substantially uniform unoriented grain structure that is essentially columnar grain free, said foils being characterized by a fatigue ductility of at least about 25% after being annealed at 177° C. for 15 minutes. In one embodiment, these foils are annealed foils characterized by a fatigue ductility of at least about 65%. The procedure for measuring fatigue ductility is given in Test Method 2.4.2.1 of IPC-TM-650. Fatigue ductility is calculated using the following equation.

$$N_f^{-0.6} D_f^{0.75} + 0.9 \frac{S_u}{E} \left[ \frac{\exp(D_f)}{0.36} \right]^{\left( 0.1785 \log \frac{10^5}{N_f} \right)} - \frac{2t_M}{2\rho + t} = 0 \qquad (I)$$

In equation (I), $D_f$ is fatigue ductility (inch/inch (×100.0%)), $N_f$ is cycles-to-failure, $S_u$ is ultimate tensile strength (psi), E is modulus of elasticity (psi), $t_M$ is core thickness (inch), t is specimen micrometer thickness (inch), p is mandrel radius of curvature (inch) within 0.005 mm [0.0002 inch].

In one embodiment, these copper foils have high ultimate tensile strengths for ease of handling and surface quality control, and high elongations at elevated temperatures for reduced cracking. In one embodiment, the copper foils have controlled low profiles. In one embodiment, the copper foils are free of oxide inclusions.

In one embodiment, these copper foils are characterized by a substantially uniform unoriented grain structure that is essentially columnar grain free. In one embodiment, these foils are essentially twin boundary free. In one embodiment, the copper foils are substantially porosity free. As indicated above, the expressions "essentially columnar grain free", "essentially twin boundary free", and "substantially porosity free" refer to the fact that in most instances microscopic or transmission election microscopy (TEM) analysis of the inventive foils demonstrates that such foils are columnar grain free, twin boundary free or porosity free, but that on occasions minor amounts of columnar grain formation, twin boundary formation and/or porosity may be observed.

In one embodiment, these copper foils as produced, prior to any annealing or heat treating, have an average grain size in the range of up to about 3 microns, and in one embodiment in the range of about 0.5 to about 3 microns, and in one embodiment about 1 to about 2 microns. In one embodiment, these foils are heat treated at 177° C. for 15 minutes, and these foils have an average grain size of up to about 5 microns, and in one embodiment about 1 to about 5 microns, and in one embodiment about 2 to about 4 microns. In one embodiment, these foils are heat treated at a temperature in excess of about 200° C. for at least about 30 minutes and these foils have an average grain size of up to about 8 microns, and in one embodiment about 3 to about 8 microns, and in one embodiment about 4 to about 7 microns.

In one embodiment, these copper foils as produced, prior to any annealing or heat treating, have a UTS at 23° C. in the transverse direction in the range of about 60,000 psi to about 95,000 psi, and in one embodiment about 60,000 psi to about 85,000 psi, and in one embodiment about 65,000 psi to about 75,000 psi, using Test Method 2.4.18 of IPC-TM-650. In one embodiment, the UTS for these foils at 180° C. in the transverse direction is in range of about 22,000 psi to about 32,000 psi, and in one embodiment about 23,000 psi to about 30,000 psi, and in one embodiment about 25,000 to about 28,000 psi using the foregoing test method. In one embodiment, the elongations for these foils at 23° C. in the transverse direction are about 8% to about 18%, and in one embodiment about 9% to about 16%, and in one embodiment about 9% to about 14% using the foregoing test method. In one embodiment, the elongations for these foils at 180° C. in the transverse direction are about 24% to about 45%, and in one embodiment about 27% to about 41%, and in one embodiment about 29% to about 38%, using the foregoing test method.

In one embodiment, these copper foils are heat treated or annealed at 177° C. for 15 minutes, and the UTS for these foils at 23° C. in the transverse direction is in the range of about 42,000 psi to about 70,000 psi, and in one embodiment about 44,000 psi to about 65,000 psi, and in one embodiment about 46,000 psi to about 60,000 psi, using Test Method 2.4.18 of IPC-TM-650. In one embodiment, the UTS for these foils at 180° C. in the transverse direction is in range of about 22,000 psi to about 32,000 psi, and in one embodiment about 23,000 psi to about 30,000 psi, and in one embodiment about 25,000 to about 28,000 psi using the foregoing test method. In one embodiment, the elongations for these foils at 23° C. in the transverse direction are about 15% to about 31%, and in one embodiment about 17% to about 27%, and in one embodiment about 19% to about 23% using the foregoing test method. In one embodiment, the elongations for these foils at 180° C. in the transverse direction are about 24% to about 45%, and in one embodiment about 27% to about 40%, and in one embodiment about 29% to about 37%, using the foregoing test method.

In one embodiment, the copper foils are heat treated or annealed at temperatures in excess of about 200° C. for time periods of about 30 minutes or more and the UTS for these foils when tested at 23° C. in the transverse direction is in the range of about 36,000 psi to about 48,000 psi, and in one embodiment about 38,000 psi to about 46,000 psi, and in one embodiment about 40,000 psi to about 45,000 psi, using Test Method 2.4.18 of IPC-TM-650. In one embodiment, the UTS for these foils when tested at 180° C. in the transverse direction is in range of about 22,000 psi to about 32,000 psi, and in one embodiment about 23,000 psi to about 30,000 psi, and in one embodiment about 25,000 to about 28,000 psi using the foregoing test method. In one embodiment, the elongations for these foils when tested at 23° C. in the transverse direction are about 23% to about 36%, and in one embodiment about 25% to about 34%, and in one embodiment about 27% to about 32% using the foregoing test method. In one embodiment, the elongations for these foils when tested at 180° C. in the transverse direction are about 25% to about 48%, and in one embodiment about 27% to about 42%, and in one embodiment about 29% to about 38%, using the foregoing test method.

In one embodiment, these copper foils as produced, prior to any annealing or heat treating, have a fatigue ductility in the transverse direction in the range of about 15% to about 60%, and in one embodiment about 15% to about 55%, and in one embodiment about 20% to about 50%, using Test Method 2.4.2.1 of IPC-TM-650. In one embodiment, these foils are heat treated at 177° C. for 15 minutes and the fatigue ductility in the transverse direction for these foils is at least about 25%, and in one embodiment in the range of about 45% to about 90%, and in one embodiment about 55% to about 80%, and in one embodiment about 65% to about 75%. In one embodiment, these foils are heat treated at a temperature in excess of about 200° C. for at least about 30 minutes and the fatigue ductility in the transverse direction for these foils is at least about 65%, and in one embodiment in the range of about 65% to about 120%, and in one embodiment about 65% to about 110%, and in one embodiment about 65% to about 100%.

In one embodiment, these copper foils as produced, prior to any annealing or heat treating, endure about 150 to about 270 flex cycles prior to breaking using a 2 mm mandrel in the transverse direction with an 84 gram load attached to the foil, and in one embodiment about 170 to about 270 flex cycles, and in one embodiment about 190 to about 250 flex cycles prior to breaking. In one embodiment, these foils are heat treated at 177° C. for 15 minutes and these foils endure about 220 to about 360 flex cycles prior to breaking, and in one embodiment about 240 to about 340 flex cycles, and in one embodiment about 260 to about 320 flex cycles prior to breaking. In one embodiment, these foils are heat treated at a temperature in excess of about 200° C. for at least about 30 minutes and these foils endure about 260 to about 500 flex cycles prior to breaking, and in one embodiment about 300 to about 440 flex cycles, and in one embodiment about 340 to about 400 flex cycles prior to breaking.

The copper foils used to make copper wire generally have a matte-side raw foil roughness, $R_{tm}$, of about 1 to about 10 microns, and in one embodiment about 2 to about 8 microns, and one embodiment about 3 to about 6 microns. $R_{tm}$ is the mean of the maximum peak-to-valley vertical extent from each of five consecutive sampling lengths, and can be measured using a Surftronic 3 profilometer marketed by Rank Taylor Hobson, Ltd., Leicester, England. The $R_{tm}$ for the shiny side of these foils is generally less than about 6 microns, and in one embodiment less than about 5 microns, and in one embodiment in the range of about 2 to about 6 microns, in the range of about 2 to about 5 microns.

The weights for these copper foils generally range from about ⅛ to about 14 ounces per square foot, and in one embodiment about ¼ to about 6 ounces per square foot, and in one embodiment about ⅜ to about 6 ounces per square foot, and in one embodiment about ½ to about 2 ounces per square foot. In one embodiment, these foils have weights of about ½, 1 or 2 ounces per square foot. A foil having a weight of ½ ounce per square foot has a nominal thickness of about 17 microns. A foil having a weight of 1 ounce per square foot has a nominal thickness of about 35 microns. A foil having a weight of 2 ounces per square foot has a nominal thickness of about 70 microns. In one embodiment, these foils have a thickness in the range of about 10 to about 250 microns. The $R_{tm}$ for the thinner foils tends to be lower than for the thicker foils. Thus, for example, foils having weights of one-half ounce per square foot have, in one embodiment, a matte side raw foil $R_{tm}$ in the range of about 1 to about 4 microns, while foils having weights of 2 ounces per square foot have, in one embodiment, a matte side raw foil $R_{tm}$ in the range of about 5 to about 7 microns.

In one embodiment, the invention relates to a process for making copper wire which involves electrodeposition of copper foil using electrolyte solutions employing critical concentrations of chloride ions at levels of about 5 ppm or less and preferably zero, and organic additives (e.g., animal glue) of about 0.2 ppm or less and preferably zero, then cutting the foil to form one or more strands of wire, then shaping the strands of wire to provide the strands with a desired cross-sectional shape and size.

The electrolyte solution is formed by dissolving a copper feed stock, which can be copper shot, copper wire, copper oxide or recycled copper, in a sulfuric acid solution. The copper feedstock, sulfuric acid and water are preferably high purity grade materials. The electrolyte solution can be subjected to a purification or filtering process prior to entering the electroforming cell. When voltage is applied between the anode and cathode, electrodeposition of copper occurs at the cathode. The electric current is preferably direct current or alternating current with a direct current bias.

The cathode can be vertically or horizontally mounted and is in the form of a cylindrical mandrel. The anode is adjacent to the cathode and has a curved shape conforming to the curved shape of the cathode to provide a uniform gap between the anode and the cathode. The gap between the cathode and the anode generally measures from about 0.2 to about 2 centimeters. In one embodiment, the anode is insoluble and made of lead, lead alloy, or titanium coated with a platinum family metal (i.e., Pt, Pd, Ir, Ru) or oxide thereof. The cathode has a smooth surface for receiving the electrodeposited copper and the surface is, in one embodiment, made of stainless steel, chrome plated stainless steel, titanium, or titanium alloy.

In one embodiment, electrodeposited copper foil is formed on a horizontally mounted rotating cylindrical cathode and then is peeled off as a thin web as the cathode rotates. This thin web of copper foil is cut to form one or more strands of copper wire, and then the strands of copper wire are shaped to provide a desired cross-sectional shape and size.

In embodiment, copper foil is electrodeposited on a vertically mounted cathode to form a thin cylindrical sheath of copper around the cathode. This cylindrical sheath of copper is score cut to form a thin strand of copper wire which is peeled off the cathode and then shaped to provide a desired cross-sectional shape and size.

The velocity of the flow of the electrolyte solution through the gap between the anode and the cathode is generally in the range of about 0.2 to about 3 meters per second, and in one embodiment about 0.5 to about 2.5 meters per second, and in one embodiment about 0.7 to about 2 meters per second. The electrolyte solution generally has a free sulfuric acid concentration in the range of about 10 to about 150 grams per liter, and in one embodiment about 40 to about 110 grams per liter, and in one embodiment about 50 to about 90 grams per liter. The temperature of the of the electrolyte solution in the electroforming cell is generally in the range of about 40° C. to about 80° C., and in one embodiment about 45° C. to about 75° C., and in one embodiment about 50° C. to about 70° C. The copper ion concentration (contained in $CuSO_4$) is generally in the range of about 50 to about 130 grams per liter, and in one embodiment from about 65 to about 115 grams per liter, and in one embodiment about 80 to about 100 grams per liter. The current density is critical and is in the range of about 500 to about 2000 amps per square foot, and in one embodiment about 500 to about 1700 amps per square foot, and in one embodiment about 600 to about 1400 amps per square foot.

In one embodiment, copper is electrodeposited using a vertically mounted cathode rotating at a tangential velocity of up to about 400 meters per second, and in one embodiment about 10 to about 175 meters per second, and in one embodiment about 50 to about 75 meters per second, and in one embodiment about 60 to about 70 meters per second. In one embodiment, the electrolyte solution flows upwardly between the vertically mounted cathode and anode at a velocity in the range of about 0.1 to about 10 meters per second, and in one embodiment about 1 to about 4 meters per second, and in one embodiment about 2 to about 3 meters per second.

The level of undesirable impurities (other than chloride ions) in the electrolyte solution is generally less than about 10 grams per liter, and in one embodiment in the range of about 0.2 to about 5 grams per liter, and in one embodiment about 0.4 to about 2 grams per liter. These impurities include phosphates, arsenic, zinc, tin, undesirable organic impurities, and the like.

The free chloride ion concentration of the operating electrolyte solution is critical and is preferably zero, but as a practical matter is in the range of up to about 5 ppm, and in one embodiment up to about 3 ppm, and in one embodiment up to about 1 ppm. The chloride ion concentration can be less than about 0.5 ppm, and in one embodiment less than about 0.2 ppm, and in one embodiment less than about 0.1 ppm, and in one embodiment less than about 0.05 ppm. Chloride ions may be added to the electrolyte solution as HCl, NaCl or other free chloride containing species, but the concentration of such chloride ions must be maintained at the foregoing levels. The term "operating electrolyte solution" is used herein to refer to the electrolyte solution after it enters the operating electroforming cell. A method for measuring low concentrations of chloride ion in the electrolyte solution involves the use of nephelometry and a reagent which forms an insoluble precipitate with chloride ions. Using a nephelometer, the chloride ion content of the sample can be quantified at levels as low as 0.01 ppm.

It is critical that the concentration of organic additives in the electrolyte solution be in the range of up to about 0.2 ppm, and in one embodiment up to about 0.1 ppm. In one embodiment, no organic additives are added, and thus the concentration of said organic additives is zero. When organic additives are used, such additives can be one or more gelatins. The gelatins that are useful herein are heterogeneous mixtures of water-soluble proteins derived from collagen. Animal glue is a preferred gelatin. The organic additive can be selected from the group consisting of saccharin, caffeine, molasses, guar gum, gum arabic, thiourea, the polyalkylene glycols (e.g., polyethylene glycol, polypropylene glycol, polyisopropylene glycol, etc.), dithiothreitol, amino acids (e.g., proline, hydroxyproline, cysteine, etc.), acrylamide, sulfopropyl disulfide, tetraethylthiuram disulfide, alkylene oxides (e.g., ethylene oxide, propylene oxide, etc.), the sulfonium alkane sulfonates, thiocarbamoyldisulfide, or derivatives or mixtures of two or more thereof.

The copper foils, as produced in the electroforming cell, are low temperature annealable copper foils. In one embodiment, prior to being converted to wire these foils are heat treated or annealed at a sufficient temperature and for an effective period of time to induce stress relaxation and thereby increase fatigue ductility. The heat treatment temperature is generally in the range of about 120° C. to about 400° C., and in one embodiment about 140° C. to about 300° C., and in one embodiment about 160° C. to about 250° C. The duration of the heat treatment is dependent on the particular method of which the heat treatment is carried out. For example, the heat treatment may be carried out in one or more of the following ways: in an air oven, in an inert atmosphere oven, in a vacuum, by radiation, and/or by direct contact. The heat treatment may alternatively be carried out by resistance heating the foil strip, heating in a lamination press, or by post-baking after lamination. It is critical that the time of the heat treatment is long enough at a particular temperature so that the crystal structure, defects and dislocations of the copper foil complete their transformation. For instance, a large amount of foil in a large batch oven requires a relatively long heat treatment time, mainly to heat up the oven, the inner wraps on the roll, and air trapped between the wraps. A continuous heat treatment process conversely requires a relatively short time since only the copper foil entering the oven is brought up to the particular temperature. Generally, the heat treatment time is between about 0.001 to about 24 hours, and in one embodiment about 0.01 to about 6 hours, and in one embodiment about 0.03 to about 3 hours.

In one embodiment, a rotating cathode is used and copper foil is peeled off the cathode as it rotates. The foil is cut using one or several cutting steps to form a plurality of strands or ribbons of copper having cross-sections that are approximately rectangular in shape. In one embodiment, two sequential cutting steps are used. In one embodiment, the foil has a thickness in the range of about 0.001 to about 0.050 inch, or about 0.004 to about 0.010 inch. The foil is cut into strands having widths of about 0.25 to about 1 inch, or about 0.3 to about 0.7 inch, or about 0.5 inch. These strands are then cut to widths that are about 1 to about 3 times the thickness of the foil, and in one embodiment the width to thickness ratio is about 1.5:1 to about 2:1. In one embodiment a 6-ounce foil is cut into a strand having a cross-section of about 0.008×0.250 inch, then cut to a cross-section of about 0.008×0.012 inch. The strand is then rolled or drawn to provide the strand with a desired cross sectional shape and size.

In one embodiment, the copper is electrodeposited on a rotating cathode, which is in the form of a cylindrical mandrel of copper foil, until the thickness of the copper on the cathode is from about 0.005 to about 0.050 inch, or about 0.010 to about 0.030 inch, or about 0.020 inch. Electrodeposition is then discontinued and the surface of the copper is washed and dried. A score cutter is used to cut the copper into a thin strand of copper which is then peeled off the cathode. The score cutter travels along the length of the cathode as the cathode rotates. The score cutter preferably cuts the copper to within about 0.001 inch of the cathode surface. The width of the strand of copper that is cut is, in one embodiment, from about 0.005 to about 0.050 inch, or from about 0.010 to about 0.030 inch, or about 0.020 inch.

In one embodiment, the copper strand has a square or substantially square cross-section that is from about 0.005× 0.005 inch to about 0.050×0.050 inch, or about 0.010×0.010 inch to about 0.030×0.030 inch, or about 0.020×0.020 inch. The strand of copper is then rolled or drawn to provide it with a desired cross-sectional shape and size.

In one embodiment, the strands of copper wire are rolled using one or a series of Turks heads shaping mills wherein in each shaping mill the strands are pulled through two pairs of opposed rigidly-mounted forming rolls. In one embodiment, these rolls are grooved to produce shapes (e.g., rectangles, squares, etc.) with rounded edges. Powered Turks head mills wherein the rolls are driven can be used. The Turks head mill speed can be about 100 to about 5000 feet per minute, and in one embodiment about 300 to about 1500 feet per minute, and in one embodiment about 600 feet per minute.

In one embodiment, the copper wire strands are subjected to sequential passes through three Turks head mills to convert a wire with a rectangular cross section to a wire with a square cross section. In the first, the strands are rolled from a cross-section of 0.005×0.010 inch to a cross-section of 0.0052×0.0088 inch. In the second, the strands are rolled from a cross-section of 0.0052×0.0088 inch to a cross-section of 0.0054×0.0070 inch. In the third, the strands are rolled from a cross-section of 0.0054×0.0070 inch to a cross-section of 0.0056×0.0056 inch.

In one embodiment, the strands are subjected to sequential passes through two Turks head mills. In the first, the strands are rolled from a cross-section of 0.008×0.010 inch to a cross-section of 0.0087×0.0093 inch. In the second, the strands are rolled from a cross-section of 0.0087×0.0093 inch to a cross-section of 0.0090×0.0090 inch.

The strands of copper wire can be cleaned using known chemical, mechanical or electropolishing techniques. In one embodiment, strands of copper wire, which are cut from copper foil or are score cut and peeled off the cathode, are cleaned using such chemical, electropolishing or mechanical techniques before being advanced to Turks head mills for additional shaping. Chemical cleaning can be effected by passing the wire through an etching or pickling bath of nitric acid or hot (e.g., about 25° C. to 70° C.) sulfuric acid. Electropolishing can be effected using an electric current and sulfuric acid. Mechanical cleaning can be effected using brushes and the like for removing burrs and similar roughened portions from the surface of the wire. In one embodiment, the wire is degreased using a caustic soda solution, washed, rinsed, pickled using hot (e.g., about35° C.) sulfuric acid, electropolished using sulfuric acid, rinsed and dried.

In one embodiment, the strands of copper wire have relatively short lengths (e.g., about 500 to about 5000 ft, and in one embodiment about 1000 to about 3000 ft, and in one embodiment about 2000 ft), and these strands of wire are welded to other similarly produced strands of wire using known techniques (e.g., butt welding) to produce strands of wire having relatively long lengths (e.g., lengths in excess of about 100,000 ft, or in excess of about 200,000 ft, up to about 1,000,000 ft or more).

In one embodiment, the strands of copper wire are drawn through a die to provide the strands with round cross-sections. The die can be a shaped (e.g., square, oval, rectangle, etc.)-to-round pass die wherein the incoming strand of wire contacts the die in the drawing cone along a planar locus, and exits the die along a planar locus. The included die angle, in one embodiment, is about 8°, 12°, 16°, 24° or others known in the art. In one embodiment, prior to being drawn, these strands of wire are cleaned and welded (as discussed above). In one embodiment, a strand of wire having a square cross-section of 0.0056×0.0056 inch is drawn through a die in a single pass to provide a wire with a round cross-section and a cross-sectional diameter of 0.0056 inch (AWG 35). The wire can then be further drawn through additional dies to reduce the diameter.

Figure 3:
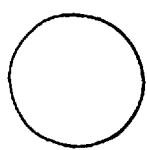
FIG. 3 illustrates a round cross sectional shape for wire made in accordance with the invention.
Figure 4:
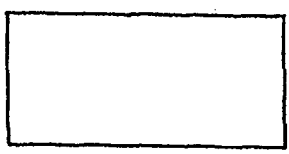
FIG. 4 illustrates a rectangular cross sectional shape for wire made in accordance with the invention.
Figure 5:
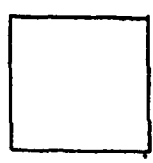
FIG. 5 illustrates a square cross sectional shape for wire made in accordance with the invention.
Figure 6:
FIG. 6 illustrates a race track cross sectional shape for wire made in accordance with the invention.
Figure 7:
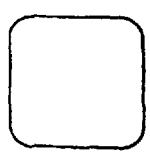
FIG. 7 illustrates a square cross sectional shapes with rounded edges for wire made in accordance with the invention.
Figure 8:
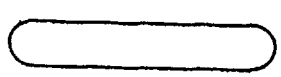
FIG. 8 illustrates a flat cross sectional shape for wire made in accordance with the invention.
Figure 9:
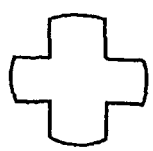
FIG. 9 illustrates a cross sectional shape in one form of a cross for wire made in accordance with the invention.
Figure 10:
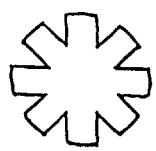
FIG. 10 illustrates a star cross sectional shape for wire made in accordance with the invention.
Figure 11:
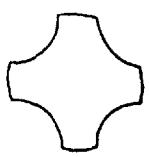
FIG. 11 illustrates a cross sectional shape of another form of a cross for wire made in accordance with the invention.
Figure 12:
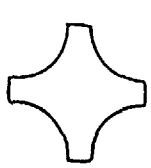
FIG. 12 illustrates a cross cross sectional shape of still another form of a cross for wire made in accordance with the invention.
Figure 13:
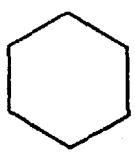
FIG. 13 illustrates a cross sectional shape in the form of a six-sided polygon for wire made in accordance with the invention.
Figure 14:
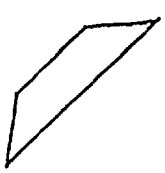
FIG. 14 illustrates a cross sectional shape in the form of a four-sided polygon for a wire made in accordance with the invention.
Figure 15:
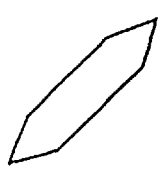
FIG. 15 illustrates a cross sectional shape in the form of another six-sided polygon for wire made in accordance with the invention.
Figure 16:
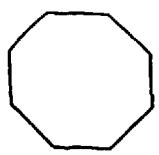
FIG. 16 illustrates a cross sectional shape in the form of an eight-sided polygon for wire made in accordance with the invention.
Figure 17:
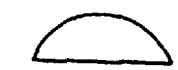
FIG. 17 illustrates a cross sectional shape in the form of a semi-circle for wire made in accordance with the invention.
Figure 18:
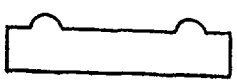
FIG. 18 illustrates a cross sectional shape in the form of a ribbed flat for wire made in accordance with the invention.
Figure 19:
FIG. 19 illustrates a cross sectional shape in the form of still another cross for wire made in accordance with the invention.
Figure 20:
FIG. 20 illustrates a cross sectional shape in the form of an oval for wire made in accordance with the invention.

Generally, the copper wire can have any cross-sectional shape that is conventionally available. These include the cross sectional shapes illustrated in FIGS. 3–20.Included are round cross sections (FIG. 3), squares (FIGS. 5 and 7), rectangles (FIG. 4), flats (FIG. 8), ribbed flats (FIG. 18), race tracks (FIG. 6), polygons (FIGS. 13–16), crosses (FIGS. 9, 11, 12 and 19), stars (FIG. 10), semi-circles (FIG. 17), ovals (FIG. 20), etc. The edges on these shapes can be sharp (e.g., FIGS. 4, 5, 13–16) or rounded (e.g., FIGS. 6–9, 11 and 12). These wires can be shaped using one or a series of Turks heads mills to provide the desired shape and size. They can have cross sectional diameters or major dimensions in the range of about 0.0002 to about 0.02 inch, and in one embodiment about 0.001 to about 0.01 inch, and in one embodiment about 0.001 to about 0.005 inch.

In one embodiment, the wire has a round cross section and a diameter in the range of about 0.0002 to about 0.02 inch, and in one embodiment about 0.001 to about 0.01 inch, and in one embodiment about 0.001 to about 0.005 inch.

In one embodiment, the copper wire is coated with one or more of the following coatings:

(1) Lead, or lead alloy (80 Pb-20Sn) ASTM B189
(2) Nickel ASTM B355
(3) Silver ASTM B298
(4) Tin ASTM B33

These coatings are applied to (a) retain solderability for hookup-wire applications, (b) provide a barrier between the metal and insulation materials such as rubber, that would react with the metal and adhere to it (thus making it difficult to strip insulation from the wire to make an electrical connection) or (c) prevent oxidation of the metal during high-temperature service.

Tin-lead alloy coatings and pure tin coatings are the most common; nickel and silver are used for specialty and high-temperature applications.

The copper wire can be coated by hot dipping in a molten metal bath, electroplating or cladding. In one embodiment, a continuous process is used; this permits "on line" coating following the wire-drawing operation.

Stranded wire can be produced by twisting or braiding several wires together to provide a flexible cable. Different degrees of flexibility for a given current-carrying capacity can be achieved by varying the number, size and arrangement of individual wires. Solid wire, concentric strand, rope strand and bunched strand provide increasing degrees of flexibility; within the last three categories, a larger number of finer wires can provide greater flexibility.

Stranded wire and cable can be made on machines known as "bunchers" or "stranders." Conventional bunchers are used for stranding small-diameter wires (34 AWG up to 10 AWG). Individual wires are payed off reels located alongside the equipment and are fed over flyer arms that rotate about the take-up reel to twist the wires. The rotational speed of the arm relative to the take-up speed controls the length of lay in the bunch. For small, portable, flexible cables, individual wires are usually 30 to 44 AWG, and there may be as many as 30,000 wires in each cable.

A tubular buncher, which has up to 18 wire-payoff reels mounted inside the unit, can be used. Wire is taken off each reel while it remains in a horizontal plane, is threaded along a tubular barrel and is twisted together with other wires by a rotating action of the barrel. At the take-up end, the strand passes through a closing die to form the final bunch configuration. The finished strand is wound onto a reel that also remains within the machine.

In one embodiment, the wire is coated or covered with an insulation or jacketing. Three types of insulation or jacketing materials can be used. These are polymeric, enamel, and paper-and-oil.

In one embodiment, the polymers that are used are polyvinyl chloride (PVC), polyethylene, ethylene propylene rubber (EPR), silicone rubber, polytetra-fluoroethylene (PTFE) and fluorinated ethylene propylene (FEP). Polyamide coatings are used where fire-resistance is of prime importance, such as in wiring harnesses for manned space vehicles. Natural rubber can be used. Synthetic rubbers can be used wherever good flexibility must be maintained, such as in welding or mining cable.

Many varieties of PVC are useful. These include several that are flame-resistant. PVC has good dielectric strength and flexibility, and is particularly useful because it is one of the least expensive conventional insulating and jacketing materials. It is used mainly for communication wire, control cable, building wire and low-voltage power cables. PVC insulation is normally selected for applications requiring continuous operation at low temperatures up to about 75° C.

Polyethylene, because of its low and stable dielectric constant, is useful when better electrical properties are required. It resists abrasion and solvents. It is used chiefly for hookup wire, communication wire and high-voltage cable. Cross-linked polyethylene (XLPE), which is made by adding organic peroxides to polyethylene and then vulcanizing the mixture, yields better heat-resistance, better mechanical properties, better aging characteristics, and freedom from environmental stress cracking. Special compounding can provide flame-resistance in cross-linked polyethylene. The usual maximum sustained operating temperature is about 90° C.

PTFE and FEP are used to insulate jet aircraft wire, electronic equipment wire and specialty control cables, where heat resistance, solvent resistance and high reliability are important. These electrical cables can operate at temperatures up to about 250° C.

These polymeric compounds can be applied over the wire using extrusion. The extruders are machines that convert pellets or powders of thermoplastic polymers into continuous covers. The insulating compound is loaded into a hopper that feeds it into a long, heated chamber. A continuously revolving screw moves the pellets into the hot zone, where the polymer softens and becomes fluid. At the end of the chamber, molten compound is forced out through a small die over the moving wire, which also passes through the die opening. As the insulated wire leaves the extruder it is water-cooled and taken up on reels. Wire jacketed with EPR and XLPE preferably go through a vulcanizing chamber prior to cooling to complete the cross-linking process.

Film-coated wire, usually fine magnet wire, generally comprises a copper wire coated with a thin, flexible enamel film. These insulated copper wires are used for electromagnetic coils in electrical devices, and must be capable of withstanding high breakdown voltages. Temperature ratings range from about 105° C. to about 220° C., depending on enamel composition. Useful enamels are based on polyvinyl acetals, polyesters and epoxy resins.

The equipment for enamel coating the wire is designed to insulate large numbers of wires simultaneously. In one embodiment, wires are passed through an enamel applicator that deposits a controlled thickness of liquid enamel onto the wire. Then the wire travels through a series of ovens to cure the coating, and finished wire is collected on spools. In order to build up a heavy coating of enamel, it may be necessary to pass wires through the system several times. Powder-coating methods are also useful. These avoid evolution of solvents, which is characteristic of curing conventional enamels, and thus make it easier for the manufacturer to meet OSHA and EPA standards. Electrostatic sprayers, fluidized beds and the like can be used to apply such powdered coatings.

Referring now to the illustrated embodiments, and initially to FIG. 1, a process for making copper wire is disclosed wherein copper is electrodeposited on a cathode to form a thin cylindrical sheath of copper around the cathode; this cylindrical sheath of copper is then score cut to form a thin strand of copper wire which is peeled off the cathode and then shaped to provide the wire with a desired cross sectional shape and size (e.g., round cross section with a cross sectional diameter of about 0.0002 to about 0.02 inch). The apparatus used with this process includes an electroforming cell 10 that includes vessel 12, vertically mounted cylindrical anode 14, and vertically mounted cylindrical cathode 16. Vessel 12 contains Electrolyte solution 18. Also included are score cutter 20, Turks head shaping mill 22, die 24 and reel 26. Cathode 16 is shown in phantom submerged in electrolyte 18 in vessel 12; it is also shown removed from vessel 12 adjacent score cutter 20. When cathode 16 is in vessel 12, anode 14 and cathode 16 are coaxially mounted with cathode 16 being positioned within anode 14. The gap between anode 14 and cathode 16 is, in one embodiment, in the range of about 0.2 to about 2 centimeters. Cathode 16 rotates at a tangential velocity of up to about 400 meters per second, and in one embodiment about 10 to about 175 meters per second, and in one embodiment about 50 to about 75 meters per second, and in one embodiment about 60 to about 70 meters per second. The electrolyte solution 18 flows upwardly between the cathode 16 and anode 14 at a velocity in the range of about 0.1 to about 10 meters per second, and in one embodiment about 1 to about 4 meters per second, and in one embodiment about 2 to about 3 meters per second.

A voltage is applied between anode 14 and cathode 16 to effect electrodeposition of the copper on to the cathode. In one embodiment, the current that is used is a direct current, and in one embodiment it is an alternating current with a direct current bias. Copper ions in electrolyte 18 gain electrons at the peripheral surface 17 of cathode 16 whereby metallic copper plates out in the form of a cylindrical sheath of copper 28 around on the surface 17 of cathode 16. Electrodeposition of copper on cathode 16 is continued until the thickness of the copper sheath 28 is at a desired level, e.g., about 0.005 to about 0.050 inch. Electrodeposition is then discontinued. The cathode 16 is removed from the vessel 12. Copper sheath 28 is washed and dried. Score cutter 20 is then activated to cut copper sheath 28 into a thin continuous strand 30. Score cutter 20 travels along screw 32 as cathode 16 is rotated about its center axis by support and drive member 34. Rotary blade 35 cuts copper sheath 28 to within about 0.001 inch of the surface 17 of cathode 16. Wire strand 36, which has a rectangular cross-section, is peeled off cathode 16, advanced through Turks head mill 22 wherein it is rolled to convert the cross sectional shape of the wire strand to a square shape. The wire is then drawn through die 24 wherein the cross sectional shape is converted to a round cross-section. The wire is then wound on reel 26.

The process depletes the electrolyte solution 18 of copper ions and organic additives, if such organic additives are used. These ingredients are continuously replenished. Electrolyte solution 18 is withdrawn from vessel 12 through line 40 and recirculated through filter 42, digester 44 and filter 46, and then is reintroduced into vessel 12 through line 48. Sulfuric acid from vessel 50 is advanced to digester 44 through line 52. Copper from a source 54 is introduced into digester 44 along path 56. In one embodiment, the copper that is introduced into digester 44 is in the form of copper shot, scrap copper wire, copper oxide or recycled copper. In digester 44, the copper is dissolved by the sulfuric acid and air to form a solution containing copper ions.

Organic additives, when used, are added to the recirculating solution in line 40 from a vessel 58 through line 60, or to the recirculating solution in line 48 through line 62 from a vessel 64. The addition rate for these organic additives is, in one embodiment, in the range of up to about 0.1 mg/min/kA, and in one embodiment up to about 0.07 mg/min/kA. In one embodiment, no organic additives are added.

Figure 2:
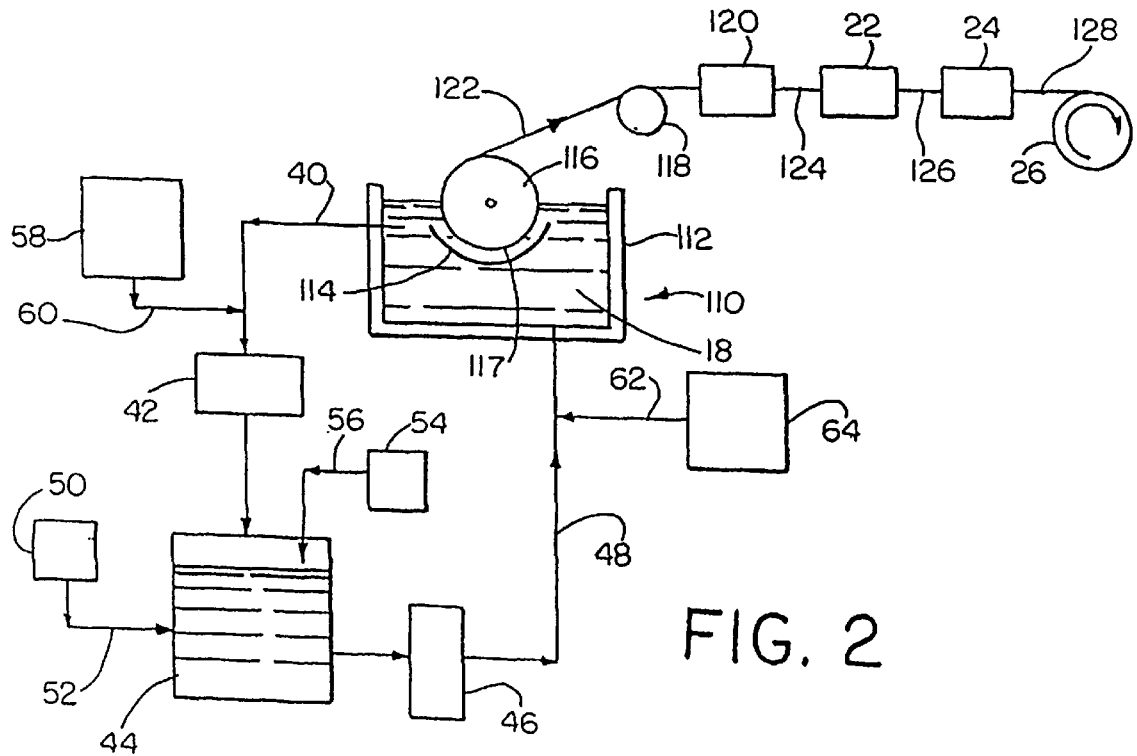
FIG. 2 is a flow sheet illustrating another embodiment of the invention wherein copper is electrodeposited on a horizontally oriented cathode to form copper foil, and then the foil is removed from the cathode, cut to form one or more strands of copper wire, and then the strands of copper wire are shaped to form copper wire with desired cross-sectional shapes and sizes.

The illustrated embodiment disclosed in FIG. 2 is identical to the embodiment disclosed in FIG. 1 except that electroforming cell 10 in FIG. 1 is replaced by electroforming cell 110 in FIG. 2; vessel 12 is replaced by vessel 112; cylindrical anode 14 is replaced by curved anode 114; vertically mounted cylindrical cathode 16 is replaced by horizontally mounted cylindrical cathode 116; and score cutter 20, screw 32 and support and drive member 34 are replaced by roller 118 and slitter 120.

In the electroforming cell 110, a voltage is applied between anode 114 and cathode 116 to effect electrodeposition of copper on the cathode. In one embodiment, the current that is used is a direct current, and in one embodiment it is an alternating current with a direct current bias. Copper ions in electrolyte solution 18 gain electrons at the peripheral surface 117 of cathode 116 whereby metallic copper plates out in the form of a copper foil layer on surface 117. Cathode 116 rotates about its axis and the foil layer is withdrawn from cathode surface 117 as continuous web 122. The electrolyte is circulated and replenished in the same manner as described above for the embodiment disclosed in FIG. 1.

Copper foil 122 is peeled off cathode 116 and passes over roller 118 into and through slitter 120 wherein it is slit into a plurality of continuous strands 124 of copper wire having cross-sections that are rectangular or substantially rectangular in shape. In one embodiment, the copper foil 122 is advanced to slitter 120 in a continuous process. In one embodiment, the copper foil is peeled off cathode 116, stored in roll form, and then later advanced through the slitter. The rectangular strands 124 are advanced from slitter 120 through Turks head mill 22 wherein they are rolled to provide strands 126 having square cross-sections. Strands 126 are then drawn through die 24 wherein they are drawn to form copper wire 128 with round cross-sections. Copper wire 128 is wound on reel 26.

The following examples are provided for purposes of illustrating the invention. Unless otherwise indicated, in the following examples as well as throughout the specification and claims, all parts and percentages are by weight, all temperatures are in degrees Celsius, and all pressures are atmospheric.

EXAMPLE 1

The foil samples identified in the table below are prepared using an electrolyte solution having a copper ion concentration of 105 grams per liter, free sulfuric acid concentration of 80 grams per liter, a chloride ion concentration of <0.1 ppm, an animal glue addition rate of 0.07 mg/min/kA, and a current density of 1100 amps per square foot. The samples are heat treated or not heat treated as indicated below. The number of flex cycles are measured using a 2 mm diameter mandrel in the transverse direction with an 84 gram load attached to the foil. The foil samples have a nominal weight of 1 oz/ft². The fatigue ductility is calculated using Equation (I).

| Sample | Heat Treatment Temp. (° C.) | Heat Treatment Time (hour) | Electrolyte Temperature (° C.) | UTS @ 23° C. (lb/in²) | Flex Cycles (#) | Fatigue Ductility (%) |
|---|---|---|---|---|---|---|
| 1 | — | — | 57 | 81800 | 95 | 21.7 |
| 2 | 160 | 3 | 57 | 39200 | 331 | 80.0 |
| 3 | 170 | 3 | 57 | 38700 | 292 | 73.0 |
| 4 | 180 | 3 | 57 | 38200 | 374 | 88.4 |
| 5 | — | — | 60 | 78800 | 123 | 27.3 |
| 6 | 160 | 3 | 60 | 39000 | 410 | 94.1 |
| 7 | 170 | 3 | 60 | 39200 | 394 | 91.2 |
| 8 | 180 | 3 | 60 | 39200 | 353 | 84.0 |
| 9 | 150 | 24 | 60 | 36800 | 326 | 80.5 |
| 10 | 160 | 24 | 60 | 38700 | 378 | 88.7 |
| 11 | 170 | 24 | 60 | 37900 | 359 | 85.9 |

Figure 21:
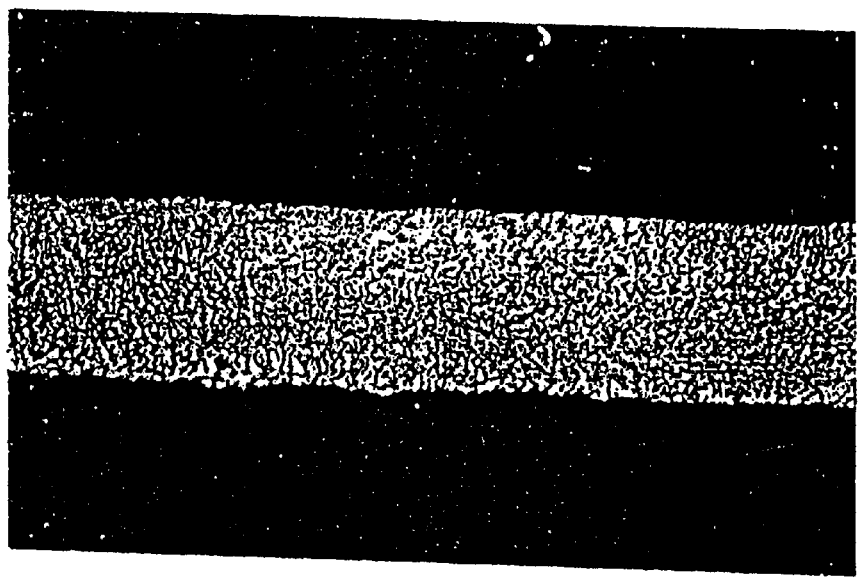
FIG. 21 is a photomicrograph taken at a magnification of 800× of the cross-section of Foil Sample No. 5 from the Example 1.
Figure 22:
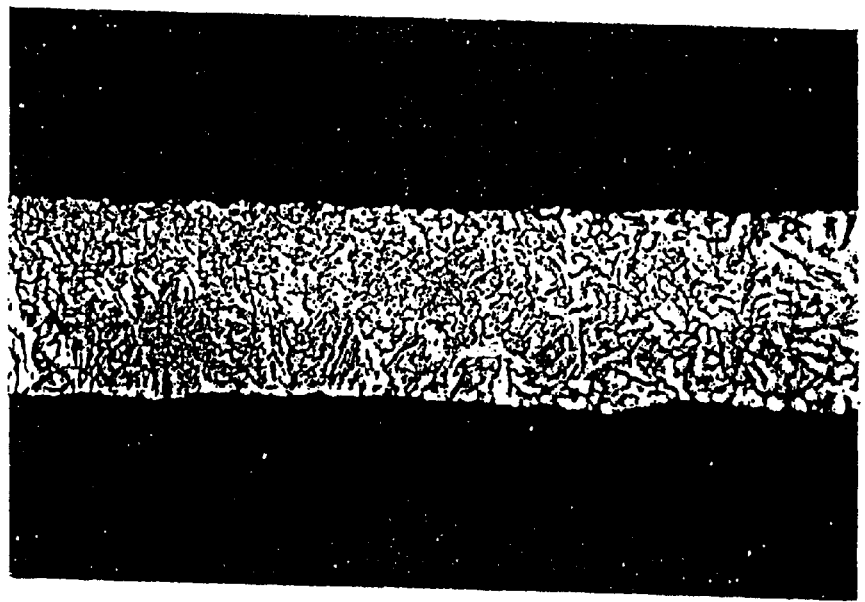
FIG. 22 is a photomicrograph taken at a magnification of 800× of the cross-section of Foil Sample No. 8 from the Example 1.

FIGS. 21 and 22 are photomicrographs taken at a magnification of 800× of cross sections of Samples 5 and 8, respectively. These photomicrographs disclose a substantially uniform unoriented grain structure that is essentially columnar grain free. These foil samples are cut, then advanced through a Turks head mill and then drawn through a die to form wire samples with round cross sections.

EXAMPLE 2

The foil samples identified in the table below are made using an electrolyte solution having a copper ion concentration of 103 grams per liter, a free sulfuric acid concentration of 60 grams per liter, a chloride ion concentration of 2.8 ppm, and an organic additive concentration of zero, i.e., no organic additives are added. The number of flex cycles are determined using a 2 mm diameter mandrel in the transverse direction with an 84 gram load attached to the foil. The foil samples have nominal weights of 1 oz/ft². The tests are conducted in the in transverse direction in accordance with IPC MF-150F.

| Sample | Heat Treatment Temp. (° C.) | Heat Treatment Time (hour) | Electrolyte Temperature (° C.) | Current Density (Amps/ft²) | UTS @ 23° C. Tensile (lb/in²) | Flex Cycles (#) | Fatigue Ductility (%) |
|---|---|---|---|---|---|---|---|
| 1 | — | — | 66 | 1090 | 68000 | 206 | 43 |
| 2 | 177 | 0.25 | 66 | 1090 | 51000 | 306 | 66 |
| 3 | 200 | 0.50 | 66 | 1090 | 45000 | 378 | 82 |
| 4 | — | — | 60 | 1090 | 75000 | 195 | 40 |
| 5 | 177 | 0.25 | 60 | 1090 | 49000 | 330 | 73 |
| 6 | 200 | 0.50 | 60 | 1090 | 42000 | 306 | 84 |
| 7 | — | — | 63 | 1000 | 70000 | 252 | 50 |
| 8 | 177 | 0.25 | 63 | 1000 | 51000 | 343 | 72 |
| 9 | 200 | 0.50 | 63 | 1000 | 46000 | 390 | 84 |
| 10 | — | — | 66 | 909 | 64000 | 228 | 46 |
| 11 | 177 | 0.25 | 66 | 909 | 52000 | 312 | 64 |
| 12 | 200 | 0.50 | 66 | 909 | 45000 | 385 | 79 |
| 13 | — | — | 60 | 909 | 72000 | 203 | 41 |
| 14 | 177 | 0.25 | 60 | 909 | 48000 | 297 | 65 |
| 15 | 200 | 0.50 | 60 | 909 | 43000 | 395 | 84 |

These foil samples are cut, then advanced through a Turks head mill and then drawn through a die to form wire samples with round cross sections.

EXAMPLE 3

The foil samples identified in the table below have a nominal weight of 1 oz/ft². The annealed sample is heat treated at 200–250° C. for 30 minutes. The low temperature annealable foil sample is heat treated at 177° C. for 15 minutes using the cycle required by IPC MF 150F for Grade 8 copper foil. The samples are tested using the cross machine direction. The number of flex cycles are measured using a 2 mm diameter mandrel in the transverse direction with an 84 gram load attached to the foil.

| Property | Units | Annealed | Low Temp. Annealable |
|---|---|---|---|
| Fatigue Ductility | % | 82 | 65 |
| Ultimate Tensile Strength | | | |
| 23° C. | psi | 42000 | 50000 |
| 180° C. | psi | 27000 | 27000 |
| Elongation | | | |
| 23° C. | % | 28 | 30 |
| 180° C. | % | 34 | 21 |
| Roughness, $R_{tm}$ | μm | 5 | 5 |
| Flex Cycles | # | 340 | 320 |
| Peel Strength | lb/in | 8 | 8 |

These foil samples are cut, then advanced through a Turks head mill and then drawn through a die to form wire samples with round cross sections.

EXAMPLE 4

Electrodeposited copper foil of the type disclosed above as Sample No. 5 of Example 1 having a width of 84" inches, a thickness of 0.008" inch and a length of 600 feet is collected on a roll. The foil is reduced using a series of slitters from the original width of 84" to 0.25" wide ribbons.

The first slitter reduces the width from 84" inches to 24", the second from 24" to 2", and the third from 2" to 0.25" inch. The 0.25" ribbons are slit to 0.012" wide ribbons. These ribbons, or slit-sheared copper wires, have a cross section of 0.008×0.012". This copper wire is prepared for metal shaping and forming operations. This consists of degreasing, washing, rinsing, pickling, electropolishing, rinsing, and drying. Single strands of wire are welded together and spooled for pay-off into further processing. The strands of wire are clean and burr-free. They are shaped to a round cross section using a combination of rolls and drawing dies. The first pass uses a miniaturized powered Turks head shaping mill to reduce the 0.012" dimension sides to approximately 0.010–0.011". The next pass is through a second Turks head mill wherein this dimension is further compressed to approximately 0.008–0.010", with the overall cross section being squared. Both passes are compressive, relative to the dimensions cited above, with an increase in the transverse dimension (the dimension in the cross section direction perpendicular to the direction of compression) and an increase in wire length. The edges are rounded with each pass. The wire is then passed through a drawing die wherein it is rounded and elongated having a diameter of 0.00795", AWG 32.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A process for making copper wire comprising:
   (A) cutting copper foil to form at least one strand of copper wire, said copper foil being an annealable electrodeposited copper foil having a thickness of about 10 to about 250 microns and a substantially uniform unoriented grain structure that is essentially columnar grain free, said foil being characterized by having the property of a fatigue ductility of at least about 25% when it is annealed at 177° C. for 15 minutes; and
   (B) shaping said strand of wire to provide said strand with desired cross-sectional shape and size.

2. The process of claim 1 wherein said foil is annealed, said foil being characterized by a fatigue ductility of at least about 65%.

3. The process of claim 1 wherein said foil has an ultimate tensile strength at 23° C. in the range of about 60,000 to about 95,000 psi.

4. The process of claim 1 wherein said foil has an elongation at 23° C. in the range of about 8% to about 18%.

5. The process of claim 1 wherein said foil has an ultimate tensile at 180° C. in the range of about 22,000 to about 32,000 psi.

6. The process of claim 1 wherein said foil has an elongation at 180° C. in the range of about 23% to about 37%.

7. The process of claim 1 wherein said foil has an ultimate tensile strength at 23° C. in the range of about 42,000 to about 70,000 psi after being annealed at 177° C. for 15 minutes.

8. The process of claim 1 wherein said foil has an elongation at 23° C. in the range of about 15% to about 31% after being annealed at 177° C. for 15 minutes.

9. The process of claim 1 wherein said foil has an ultimate tensile strength at 180° C. in the range of about 22,000 to about 32,000 psi after being annealed at 177° C. for 15 minutes.

10. The process of claim 1 wherein said foil has an elongation at 180° C. in the range of about 24% to about 38% after being annealed at 177° C. for 15 minutes.

11. The process of claim 2 wherein said foil has an ultimate tensile strength at 23° C. in the range of about 36,000 to about 48,000 psi.

12. The process of claim 2 wherein said foil has an elongation at 23° C. in the range of about 23% to about 36%.

13. The process of claim 2 wherein said foil has an ultimate tensile strength at 180° C. in the range of about 22,000 to about 32,000 psi.

14. The process of claim 2 wherein said foil has an elongation at 180° C. in the range of about 25% to about 40%.

15. The process of claim 1 wherein the average grain size for said foil is up to about 3 microns.

16. The process of claim 1 wherein the average grain size for said foil after being annealed at 177° C. for 15 minutes is up to about 5 microns.

17. The process of claim 2 wherein the average grain size for said foil is up to about 8 microns.

18. The process of claim 1 wherein said wire has a round cross-sectional shape.

19. The process of claim 1 wherein said wire has a square or rectangular cross-sectional shape.

20. The process of claim 1 wherein said wire has a cross-sectional shape in the form of a cross, star, semi-circle, polygon, race track, oval, flat or ribbed-flat.

21. The process of claim 1 wherein said wire has a cross-sectional shape in a form substantially as illustrated in any one of FIGS. 3–20.

* * * * *